United States Patent
Oh et al.

(10) Patent No.: US 8,964,481 B2
(45) Date of Patent: Feb. 24, 2015

(54) NONVOLATILE MEMORY DEVICE AND SUB-BLOCK MANAGING METHOD THEREOF

(71) Applicants: Eun Chu Oh, Suwon-si (KR); Junjin Kong, Yongin-si (KR)

(72) Inventors: Eun Chu Oh, Suwon-si (KR); Junjin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/014,504

(22) Filed: Aug. 30, 2013

(65) Prior Publication Data

US 2014/0063938 A1    Mar. 6, 2014

(30) Foreign Application Priority Data

Aug. 31, 2012   (KR) ........................ 10-2012-0096419

(51) Int. Cl.
| | |
|---|---|
| *G11C 16/04* | (2006.01) |
| *G11C 16/16* | (2006.01) |
| *G11C 16/34* | (2006.01) |
| *H01L 27/115* | (2006.01) |

(52) U.S. Cl.
CPC ............ *G11C 16/16* (2013.01); *G11C 16/0483* (2013.01); *G11C 16/3418* (2013.01); *H01L 27/11524* (2013.01); *H01L 27/11556* (2013.01); *H01L 27/1157* (2013.01); *H01L 27/11582* (2013.01)
USPC ............. 365/185.29; 365/185.18; 365/185.11

(58) Field of Classification Search
CPC ...... G11C 16/16; G11C 16/14; G11C 16/344; G11C 2213/71; G11C 5/145; G11C 5/147
USPC ............ 365/185.29, 185.18, 185.11, 185.23, 365/189.09
See application file for complete search history.

(56) References Cited

U.S. PATENT DOCUMENTS

| | | | |
|---|---|---|---|
| 7,057,915 B2 | 6/2006 | Futatsuyama | |
| 7,092,294 B2 | 8/2006 | Sato et al. | |
| 7,161,842 B2 | 1/2007 | Park | |
| 7,193,897 B2 | 3/2007 | Lee | |
| 7,542,353 B2 | 6/2009 | Park | |
| 7,551,492 B2 | 6/2009 | Kim | |
| 7,804,718 B2 | 9/2010 | Kim | |
| 7,813,184 B2 * | 10/2010 | Kim et al. ................ | 365/185.29 |
| 2010/0238732 A1 | 9/2010 | Hishida et al. | |

(Continued)

FOREIGN PATENT DOCUMENTS

| | | |
|---|---|---|
| JP | 2011048871 A | 3/2011 |
| JP | 2012069224 A | 4/2012 |

(Continued)

*Primary Examiner* — David Lam
(74) *Attorney, Agent, or Firm* — Volentine & Whitt, PLLC

(57) ABSTRACT

A nonvolatile memory device includes a memory block, a row decoder, a voltage generator and control logic. The memory block includes memory cells stacked in a direction intersecting a substrate, the memory block being divided into sub-blocks configured to be erased independently. The row decoder is configured to select the memory block by a sub-block unit. The voltage generator is configured to generate an erase word line voltage to be provided to a first word line of a selected sub-block of the sub-blocks and a cut-off voltage, higher than the erase word line voltage, to be provided to a second word line of the selected sub-block during an erase operation. The control logic is configured to control the row decoder and the voltage generator to perform an erase operation on the selected sub-block.

20 Claims, 12 Drawing Sheets

(56) References Cited

U.S. PATENT DOCUMENTS

| | | |
|---|---|---|
| 2011/0051527 A1 | 3/2011 | Kirisawa et al. |
| 2011/0194357 A1 | 8/2011 | Han et al. |
| 2011/0199825 A1 | 8/2011 | Han et al. |
| 2011/0216603 A1 | 9/2011 | Han et al. |
| 2011/0286269 A1 | 11/2011 | Pascucci et al. |

FOREIGN PATENT DOCUMENTS

| | | |
|---|---|---|
| KR | 1020100010692 A | 2/2010 |
| KR | 1020100076738 A | 7/2010 |
| KR | 1020130042780 A | 4/2013 |

* cited by examiner

Fig. 4

| String | Erase Bias — SB1 Erase | Note (MLC level) |
|---|---|---|
| BL | Float | – |
| SSL1 — SST | Float | – |
| SB2: WL<11> — MC11 | Float | n-bit |
| WL<10> — MC10 | Float | |
| WL<9> — MC9 | Float | |
| WL<8> — MC8 | Float | |
| SB1: WL<7> — MC7 | Vouter | m-bit |
| WL<6> — MC6 | Vinner | n-bit |
| WL<5> — MC5 | Vinner | |
| WL<4> — MC4 | Vouter | m-bit |
| SB0: WL<3> — MC3 | Float | n-bit |
| WL<2> — MC2 | Float | |
| WL<1> — MC1 | Float | |
| WL<0> — MC0 | Float | |
| GSL — GST | Float | – |
| CSL/Sub | Vers | – |

(Vinner < Vouter < Vunsel < Vers, m ≤ n)

Fig. 5

| String | SB1 Erase Bias | Note (MLC level) |
|---|---|---|
| BL | Float | - |
| SSL1 — SST | Float | - |
| SB2: WL<3k-1> — MC3k-1, WL<3k-2> — MC3k-2, ... WL<2k+1> — MC2k+1, WL<2k> — MC2k | Float | n-bit |
| SB1: WL<2k-1> — MC2k-1 | Vouter1 | 1-bit |
| WL<2k-2> — MC2k-2 | Vouter2 | m-bit |
| ... | Vinner | n-bit |
| WL<k+1> — MCk+1 | Vouter2 | m-bit |
| WL<k> — MCk | Vouter1 | 1-bit |
| SB0: WL<k-1> — MCk-1, WL<k-2> — MCk-2, ... WL<1> — MC1, WL<0> — MC0 | Float | n-bit |
| GSL — GST | Float | - |
| CSL/Sub | Vers | - |

(Vinner < Vouter2 < Vouter1 < Vunsel < Vers, 1 ≤ m ≤ n)

NONVOLATILE MEMORY DEVICE AND SUB-BLOCK MANAGING METHOD THEREOF

CROSS-REFERENCE TO RELATED APPLICATIONS

A claim for priority under 35 U.S.C. §119 is made to Korean Patent Application No. 10-2012-0096419, filed Aug. 31, 2012, in the Korean Intellectual Property Office, the entire contents of which are hereby incorporated by reference.

BACKGROUND

The inventive concepts described herein relate to a semiconductor memory device, and more particularly, relate to a nonvolatile memory device and a sub-block managing method thereof.

Semiconductor memory devices may be volatile or nonvolatile. The volatile semiconductor memory devices perform read and write operations at a high speed, while contents stored therein may be lost at power-off. The nonvolatile semiconductor memory devices may retain contents stored therein even at power-off. The nonvolatile semiconductor memory devices may be used to store contents that must be retained regardless of whether they are powered.

A flash memory device is a typical nonvolatile semiconductor memory device. A flash memory device may be used as a voice and image data storing medium for information appliances, such as a computer, a cellular phone, a PDA, a digital camera, a camcorder, a voice recorder, an MP3 player, a handheld PC, a game machine, a facsimile, a scanner, a printer, and the like.

Recently, semiconductor memory devices having memory cells that are stacked in three dimensions have been researched to improve integrity of the semiconductor memory devices. However, increases in storage capacity may cause various problems due to mismatch with conventional memory management policies, for example.

SUMMARY

In accordance with an aspect of the inventive concept, a nonvolatile memory device includes a memory block, a row decoder, a voltage generator and control logic. The memory block includes memory cells stacked in a direction intersecting a substrate, the memory block being divided into sub-blocks configured to be erased independently. The row decoder is configured to select the memory block by a sub-block unit. The voltage generator is configured to generate an erase word line voltage to be provided to a first word line of a selected sub-block of the sub-blocks and a cut-off voltage, higher than the erase word line voltage, to be provided to a second word line of the selected sub-block during an erase operation. The control logic is configured to control the row decoder and the voltage generator to perform an erase operation on the selected sub-block.

In accordance with another aspect of the inventive concept, a sub-block managing method of a memory system, including a nonvolatile memory device, is provided to erase memory cells by sub-block unit, a sub-block being smaller than a physical block of the nonvolatile memory device. The sub-block managing method includes performing an erase operation on a selected sub-block by providing at least one word line of the selected sub-block with a cut-off voltage for blocking interference with an unselected sub-block; checking an erase status of the selected sub-block; and adaptively compensating for data reliability of memory cells connected to the at least one word line provided with the cut-off voltage based on the checked erase status.

In accordance with another aspect of the inventive concept, a memory system provided includes a nonvolatile memory device and a memory controller. The nonvolatile memory device includes a memory cell array having at least one memory block divided into a plurality of sub-blocks, each sub-block including a plurality of word lines; and a voltage generator configured to provide a first cut-off voltage and an inner voltage to a sub-block selected from among the plurality of sub-blocks for an erase operation under control of control logic, the first cut-off voltage being higher than the inner voltage. The memory controller is configured to control the nonvolatile memory device to perform the erase operation of the selected sub-block in response to a request from a host. The voltage generator is configured to provide the first cut-off voltage to a first word line in the selected sub-block adjacent to an unselected sub-block, and to provide the inner voltage to word lines in the selected sub-block that are not adjacent to the unselected sub-block during the erase operation.

BRIEF DESCRIPTION OF THE FIGURES

Exemplary embodiments of the inventive concept will be more clearly understood from the following detailed description taken in conjunction with the accompanying drawings, wherein like reference numerals refer to like parts throughout unless otherwise specified.

FIG. 4 is a diagram illustrating a bias method during a sub-block erase operation of a nonvolatile memory device, according to an embodiment of the inventive concept.

FIG. 5 is a diagram illustrating a bias method at a sub-block erase operation of a nonvolatile memory device, according to another embodiment of the inventive concept.

DETAILED DESCRIPTION

Figure 1:
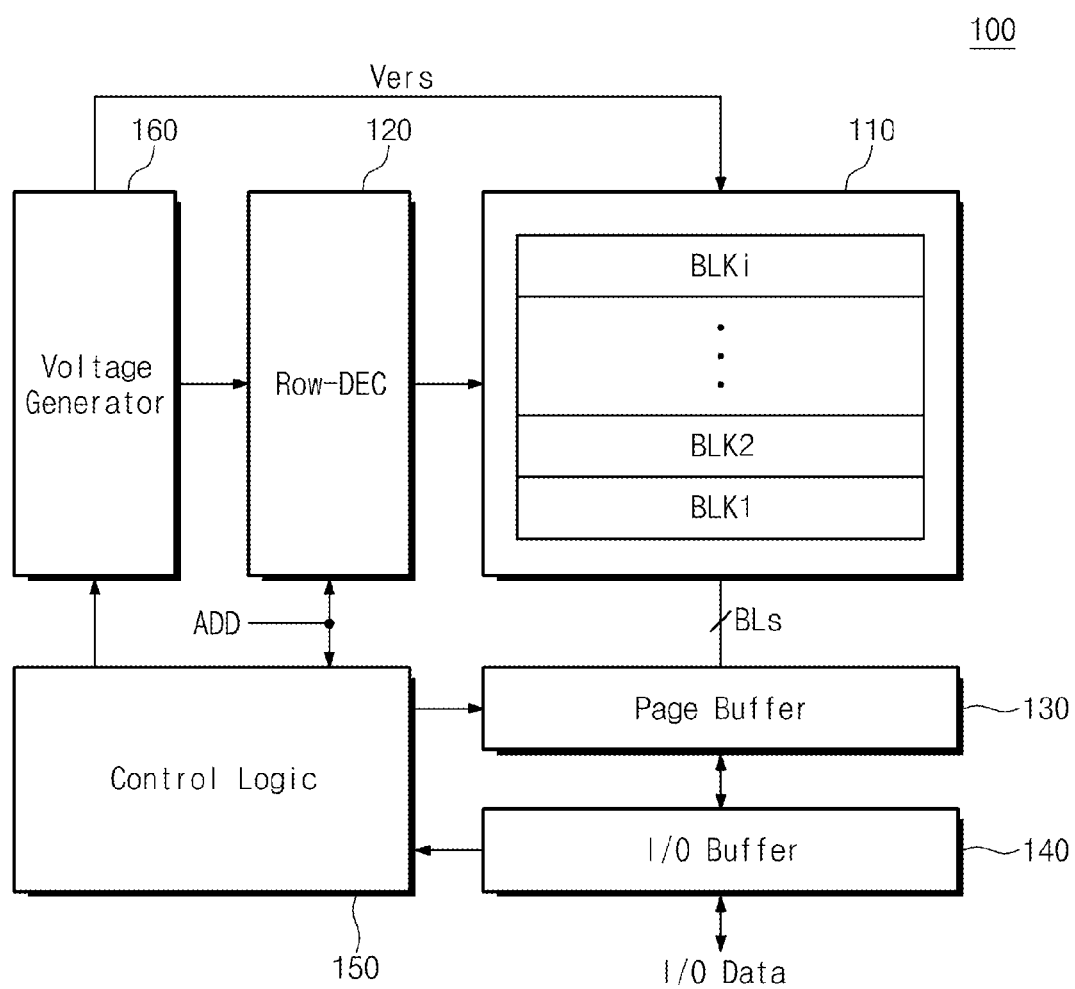
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concept will be exemplarily described using a flash memory device as a nonvolatile storage medium. However, the inventive concept is not limited thereto. Other nonvolatile memory devices may be used as a storage medium without departing from the scope of the present teachings. For example, the storage medium may be formed of phase-change random access memory (PRAM), magnetic random access memory (MRAM), resistive random access memory (ReRAM), ferroelectric random access memory (FRAM), NOR flash memory, or the like. Also, the storage medium may be applied to a memory system including different types of memory devices.

The inventive concept may be implemented as different embodiments or applied thereto. Further, various embodiments may be modified or changed according to viewpoints and applications without departing from the scope, spirit and other objects of the inventive concept. Below, the inventive concept will be described with reference to accompanying drawings.

According to various embodiments, an erase operation may be performed by memory block unit or by sub-block unit. An erase operation performed by sub-block unit may be referred to as a sub-block erase operation. During a sub-block erase operation, one or more sub-blocks of a plurality of sub-blocks in a memory block may be erased at the same time. However, the inventive concept is not limited thereto.

FIG. 1 is a block diagram schematically illustrating a nonvolatile memory device, according to an embodiment of the inventive concept. Referring to FIG. 1, a nonvolatile memory device 100 includes a memory cell array 110, a row decoder 120, a page buffer circuit 130, an input/output buffer 140, control logic 150, and a voltage generator 160.

The memory cell array 110 is coupled with the row decoder 120 via word lines and/or selection lines. The memory cell array 110 is coupled with the page buffer circuit 130 via bit lines. The memory cell array 110 may include a plurality of NAND cell strings, for example. The NAND cell strings may constitute a plurality of memory blocks BLK1 to BLKi according to a unit of operation or selection. Each of the memory blocks BLK1 to BLKi may be divided into a plurality of sub-blocks.

Herein, each of the NAND cell strings may include a channel formed in a vertical or horizontal direction. The word lines of the memory cell array 110 may be stacked in a vertical direction, and channels of the NAND cell strings may be formed in the vertical direction. A memory device including the memory cell array 110 formed to have the above-described cell string structure may be referred to as a vertical nonvolatile memory device or a three-dimensional nonvolatile memory device.

The row decoder 120 may select one of the memory blocks BLK1 to BLKi of the memory cell array 110 in response to an address ADD, e.g., provided by the control logic 150. The row decoder 120 may select one of the word lines in the selected memory block. The row decoder 120 may transfer voltages provided from the voltage generator 160 to word lines of the selected memory block. During a program operation, the row decoder 120 may transfer a program voltage/a verification voltage to a selected word line and a pass voltage to unselected word lines.

The row decoder 120 may perform selection of a sub-block unit using selection lines and a word line voltage. The row decoder 120 may perform access operations (e.g., program, erase, and read operations) on a selected sub-block. The row decoder 120 may erase memory cells by a sub-block unit. During a sub-block erase operation, the row decoder 120 may erase one sub-block selected from a group of sub-blocks in a physical block. In this case, the remaining sub-blocks (unselected sub-blocks) may be erase-inhibited.

For example, during a sub-block erase operation, the row decoder 120 may ground word lines of the selected sub-block and float word lines of the unselected sub-blocks. The row decoder 120 may provide a cut-off voltage higher than ground voltage to at least one word line, adjacent to an unselected sub-block, from among word lines of a selected sub-block. During an erase operation, influence (e.g., interference) of a word line voltage of a selected sub-block to an unselected sub-block may be minimized by the cut-off voltage.

The page buffer circuit 130 may operate as a write driver or a sense amplifier according to a mode of operation. During a program operation, the page buffer circuit 130 may provide a bit line of the memory cell array 110 with a bit line voltage corresponding to data to be programmed. During a read operation, the page buffer circuit 130 may sense data stored in a selected memory cell via a bit line. The page buffer circuit 130 may latch the sensed data to output it to an external device via the input/output buffer 140. During an erase operation, the page buffer 130 may float the bit lines.

During a program operation, the input/output buffer 140 may transfer input write data to the page buffer circuit 130. During a read operation, the input/output buffer 140 may transfer read data provided from the page buffer circuit 130 to an external device. The input/output buffer 140 may transfer input addresses or commands to the control logic 150 or the row decoder 120.

The control logic 150 may control the page buffer circuit 130 and the row decoder 120 in response to a command CMD provided by the external device via the input/output buffer 140. During an erase operation, the control logic 150 may control the row decoder 120 to erase a selected memory block (or, a physical block) or a sub-block. An erase operation of a sub-block unit will be more fully described with reference to FIG. 4.

The voltage generator 160 may generate word line voltages to be supplied to word lines and a voltage to be supplied to a bulk (e.g., a well region) where memory cells are formed, under the control of the control logic 150. The word line voltages to be supplied to word lines may include a program voltage, a pass voltage, selection and non-selection read voltages, and so on. During a read/program operation, the voltage generator 160 may generate selection line voltages to be supplied to selection lines. Also, during a sub-block erase operation, the voltage generator 160 may generate an erase voltage Vers to be supplied to a bulk to provide it to the memory cell array 110. During the sub-block erase operation, the voltage generator 160 may generate a cut-off voltage to be supplied to at least one of word lines of a selected sub-block.

The nonvolatile memory device 100 may perform an erase operation by sub-block units. A sub-block (which may be referred to as "SB") is smaller in size than a physical block (which may be referred to as "PB"). A cut-off voltage may be applied to one or more of the word lines of a selected sub-block to prevent influence by the selected sub-block on unselected sub-blocks during the sub-block erase operation. This enables the nonvolatile memory device 100 to perform an erase operation at high speed without burdens (e.g., dummy word lines or page copy) during the sub-block erase operation.

Figure 2:
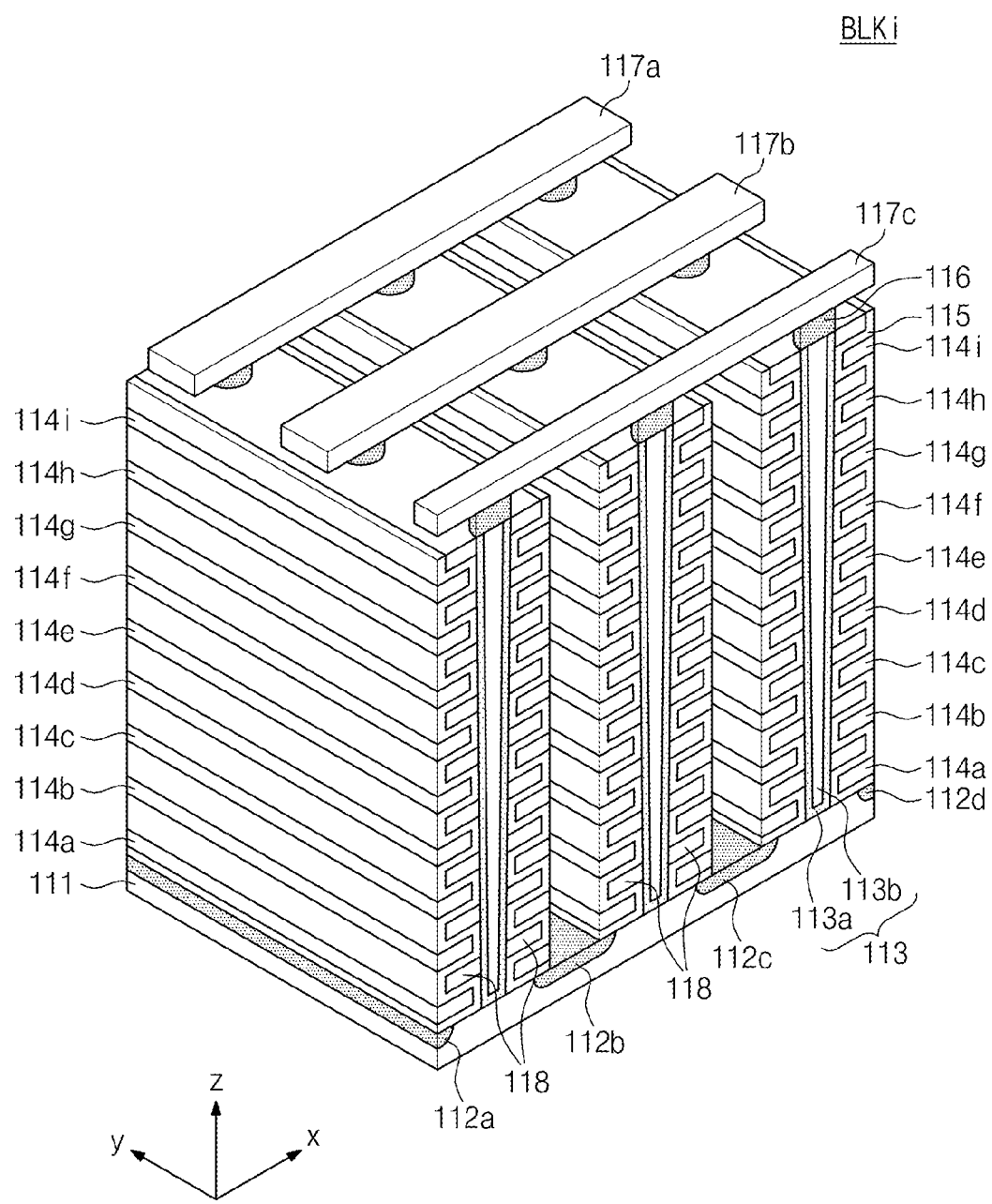
FIG. 2 is a perspective view illustrating a memory block discussed with reference to FIG. 1, according to an embodiment of the inventive concept.

FIG. 2 is a perspective view illustrating a memory block discussed with reference to FIG. 1, according to an embodiment of the inventive concept. Referring to FIG. 2, representative memory block BLKi includes structures extending along a plurality of directions x, y, and z.

A substrate 111 is provided to form the memory block BLKi. The substrate 111 may be formed of a p-well in which boron is injected, for example. Alternatively, the substrate 111 may be a pocket p-well provided within an n-well. For purposes of illustration, it is assumed that the substrate 111 is a p-well. However, the substrate 111 is not limited to a p-well.

A plurality of doping regions, indicated by first through fourth doping regions 112a, 112b, 112c, and 112d, extending in the y-direction, are arranged in the x-direction in the substrate 111. For example, the first to fourth doping regions 112a, 112b, 112c, and 112d may be formed of n-type conductors different from that of the substrate 111. Below, it is assumed that first to fourth doping regions 112a, 112b, 112c, and 112d are n-type. However, the first to fourth doping regions 112a, 112b, 112c, and 112d are not limited to the n-type.

On the substrate 111 between the first and second doping regions 112a and 112b, a plurality of insulation materials 118 extending in the y-direction are stacked sequentially in the z-direction, such that the insulation materials 118 are spaced apart in the z-direction. The insulation materials 118 may include an insulation material such as silicon oxide, for example.

On the substrate 111 between the first and second doping regions 112a and 112b, a plurality of pillars 113 are arranged sequentially in the y-direction so as to penetrate the plurality of insulation materials 118 in the z-direction. For example, the pillars 113 may contact with the substrate 111 through the insulation materials 118. Pillars 113 are formed on the substrate 111 between the second and third doping regions 112b and 112c and on the substrate 111 between the third and fourth doping regions 112c and 112d, as well.

In the depicted embodiment, each pillar 113 is formed of multiple materials. For example, a surface layer 113a of each pillar 113 may include a first-type silicon material. The silicon material may be the same type as the substrate 111. Below, it is assumed that the surface layer 113a of each pillar 113 includes p-type silicon. However, the surface layer 113a of each pillar 113 is not limited to p-type silicon.

An inner layer 113b of each pillar 113 may be formed of an insulation material. For example, the inner layer 113b of each pillar 113 may include an insulation material such as silicon oxide. The inner layer 113b of each pillar 113 may include an air gap.

An insulation film 115 is provided between the first and second doping regions 112a and 112b along exposed surfaces of the insulation materials 118, the pillars 113, and the substrate 111. In exemplary embodiments, the insulation film 115 provided on an exposed surface (toward the third direction z) of the last insulation material 118 provided along the z-direction may be removed.

First conductive materials 114a to 114i are also provided in a region between the first and second doping regions 112a and 112b, on exposed surfaces of the insulation film 115, respectively. For example, the first conductive material 114a extending along the y-direction may be provided between the substrate 111 and the insulation material 118 adjacent to the substrate 111. More particularly, the first conductive material 114a extending in the y-direction may be provided between the substrate 111 and the insulation film 115 of a lower surface of the insulation material 118 adjacent to the substrate 111.

The same structure as that between the first and second doping regions 112a and 112b is likewise provided between the second and third doping regions 112b and 112c, and between the third and fourth doping regions 112c and 112d.

Drains 116 are provided on the pillars 113, respectively. The drains 116 may be formed of a second-type silicon material. For example, the drains 116 may be formed of n-type silicon material, which is assumed for purposes of discussion. However, the drains 116 are not limited to include n-type silicon materials.

Second conductive materials 117a to 117c extending along the x-direction may be provided on the drains 116, respectively. The second conductive materials 117a to 117c are arranged sequentially in the y-direction. The second conductive materials 117a to 117c are connected with corresponding drains 116, respectively. For example, the drains 116 and the second conductive material 117c extending along the x-direction may be connected via contact plugs, respectively.

Each of the first conductive materials 114a to 114i may be used to form a word line or a selection line. For example, the first conductive lines 114b to 114h may be used to be as word lines, where conductive lines belonging to the same layer may be interconnected. The memory block BLKi may be selected when the first conductive materials 114a to 114i are all selected. In contrast, a sub-block may be selected when only a part of the first conductive materials 114a to 114i is selected. The number of layers of the first conductive materials 114a to 114i may be changed variously according to process and control techniques.

Figure 3:
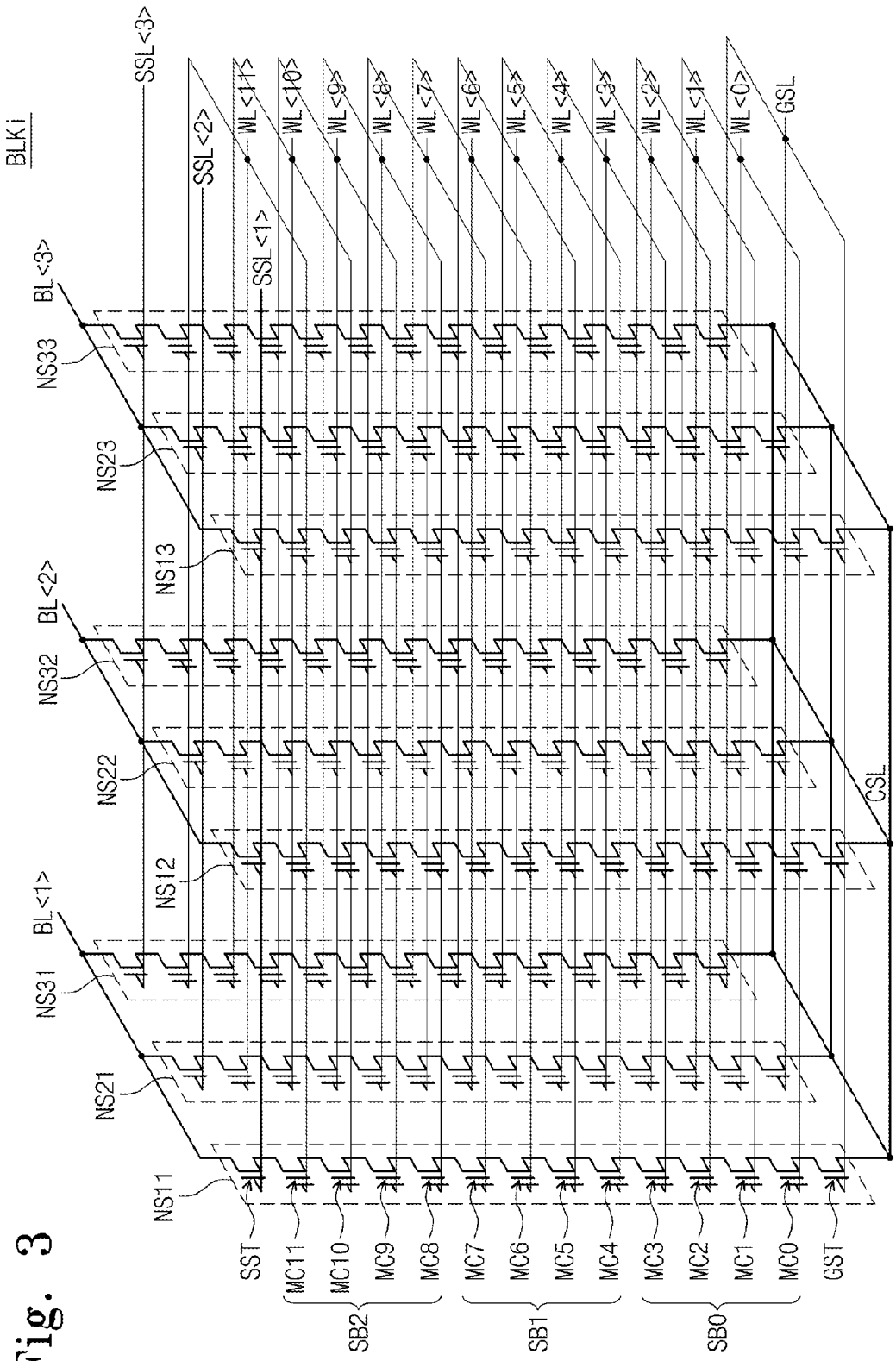
FIG. 3 is an equivalent circuit diagram of a memory block in FIG. 2, according to an embodiment of the inventive concept.

FIG. 3 is an equivalent circuit diagram of a memory block BLKi in FIG. 2, according to an embodiment of the inventive concept. Referring to FIGS. 2 and 3, each of the cell strings NS11 to NS33 is formed between a common source line CSL and one of the first to third bit lines BL<1>, BL<2>, and BL<3>. Cell strings NS11, NS21, and NS31 are provided between the first bit line BL<1> and the common source line CSL. Cell strings NS12, NS22, and NS32 are provided between a second bit line BL<2> and the common source line CSL. Cell strings NS13, NS23, and NS33 are provided between the third bit line BL<3> and the common source line CSL. The first to third bit lines BL<1> to BL<3> may correspond to second conductive materials 117a to 117c, respectively, extending in an x-direction.

A string selection transistor SST of each cell string is connected to a corresponding bit line. A ground selection transistor GST of each cell string is connected to the common source line CSL. In each cell string, memory cells MC0 to MC11 are provided between the string selection transistor SST and the ground selection transistor GST.

The cell strings may be defined by row and column. The cell strings connected in common to one bit line may form one column. For example, the cell strings NS11, NS21 and NS31 connected to the first bit line BL<1> may correspond to a first column The cell strings NS12, NS22 and NS32 connected to the second bit line BL<2> may correspond to a second column The cell strings NS13, NS23 and NS33 connected to the third bit line BL<3> may correspond to a third column.

The cell strings connected to one string selection line SSL may form one row. For example, the cell strings NS11, NS12 and NS13 connected to a first string selection line SSL<1> may form a first row. The cell strings NS21, NS22 and NS23 connected to a second string selection line SSL<2> may form a second row. The cell strings NS31, NS32 and NS33 connected to a third string selection line SSL<3> may form a third row.

Each cell string includes a ground selection transistor GST. The ground selection transistors GST may be controlled by a ground selection line GSL. Alternatively, although not shown in FIG. 3, cell strings corresponding to each row can be controlled by other ground selection lines.

Memory cells located at the same semiconductor layer share a word line. For example, memory cell MC0 of each of the cell strings NS11 to NS33 is connected to a word line WL0. Cell strings in the same row share a string selection line SSL. Cell strings in different rows are connected to different string selection lines SSL<1>, SSL<2> and SSL<3>, respectively. The common source line CSL is connected in common to cell strings. For example, the common source line CSL may be formed by interconnecting first to fourth doping regions 112a, 112b, 112c, and 112d.

According to an embodiment, the memory block BLKi is divided into a plurality of sub-blocks, indicated by representative sub-blocks SB0, SB1, and SB2, each sub-block being smaller in size than the memory block BLKi. The sub-blocks SB0, SB1 and SB2 may be divided in a word line direction, as shown in FIG. 3. Alternatively, the sub-blocks SB0, SB1 and SB2 may be divided on the basis of bit lines or string selection lines. The sub-blocks SB0, SB1 and SB2 in the memory block BLKi may be erased independently regardless of the reference used to divide the memory block into sub-blocks.

In the depicted example, the sub-block SB0 include memory cells connected to lines WL<0>, WL<1>, WL<2> and WL<3>, the sub-block SB1 includes memory cells, connected to word lines WL<4>, WL<5>, WL<6> and WL<7>, and the sub-block SB2 includes memory cells connected to word lines WL<8>, WL<9>, WL<10>, and WL<11>, from among the memory cells included in the memory block BLKi. One or more of the sub-blocks SB0, SB1, and SB2 may be selected and erased at the same time or at different times. That is, the memory cells included in the sub-block SB0 may be selected and erased independently of the remaining sub-blocks SB1 and SB2, and vice versa. A row decoder 120 of a nonvolatile memory device 100 (refer to FIG. 1) may provide a bias for erasing memory cells by sub-block unit.

As an example, a method of dividing sub-blocks defined within one memory block BLKi is described below. Notably, the reference used to divide the memory block into sub-blocks is not limited to this description. For example, the method is described for the case in which one physical block BLKi is divided into three sub-blocks, where each sub-block includes four word lines. However, the inventive concept is not limited thereto. For example, one memory block may be divided into two sub-blocks or into four or more sub-blocks. Also, one sub block may include two or three word lines, or may include five or more word lines.

FIG. 4 is a diagram illustrating a bias method during a sub-block erase operation of a nonvolatile memory device, according to an embodiment of the inventive concept. Referring to FIG. 4, there is illustrated an erase bias condition corresponding to the case in which a memory block is divided into three sub-blocks. It is assumed that memory cells are n-bit multi-level cells (n being an integer of 2 or more).

Each of cell strings constituting one memory block may be divided into three sub-blocks SB0, SB1, and SB2. A bias condition of an erase operation will be described with reference to a cell string included in a memory block. It is assumed that one sub-block SB1 is erased and that the other sub-blocks SB0 and SB2 are erase-inhibited. An erase bias when the sub-block SB1 is erased may be as follows.

A bit line, a string selection line SSL1, and a ground selection line GSL may be electrically floated. Word lines WL<0> to WL<3> and word lines WL<8> to WL<11> corresponding to the sub-blocks SB0 and SB2 may be floated. Word lines WL<4> to WL<7> corresponding to the sub-block SB1 may be provided with a bias according to an embodiment of the inventive concept. For example, a cut-off voltage Vouter may be applied to the word lines WL<4> and WL<7> adjacent to the unselected sub-blocks SB0 and SB2, respectively, and an inner voltage Vinner (or, erase word line voltage) may be applied to the word lines WL<5> and WL<6>, not adjacent to the unselected sub-blocks SB0 and SB2. The inner voltage Vinner may be a ground voltage or 0V, for example.

The cut-off voltage Vouter refers to a voltage for cutting off physical influence (e.g., interference) of a voltage, applied to the selected sub-block during the erase operation, on the unselected sub-block(s). In general, as the difference between voltages applied to adjacent word lines at the same time increases, coupling or physical disturbance may also increase. The cut-off voltage Vouter minimizes the voltage difference between adjacent word lines during the sub-block erase operation. The cut-off voltage Vouter makes it possible to effectively prevent an unselected sub-block from suffering direct or indirect physical interference.

Under the above-described bias condition, if an erase voltage Vers being a high voltage is applied to the substrate, memory cells in the sub-block SB1 are erased by F-N tunneling. Meanwhile, voltages of the floated word lines WL<0> to WL<3> and WL<8> to WL<11> in the sub-blocks SB0 and SB2 are boosted up to a high voltage level by capacitive coupling. In this case, the voltage difference between the word lines WL<0> to WL<3> and WL<8> to WL<11> and the channel is insufficient to generate F-N tunneling. It is possible to perform a selective erase operation on the sub-block SB1 by the above-described bias condition.

The sub-block SB1 may include memory cells insufficiently erased due to the cut-off voltage Vouter. After the erase operation, the insufficiently erased memory cells may be used as m-bit multi-level cells (MLCs) or single-level cells (SLCs). The remaining memory cells may be used as n-bit MLCs (n≥m, n being an integer) in a normal state. Memory cells supplied with the cut-off voltage Vouter during the sub-block erase operation may be used as m-bit MLCs during a subsequent program operation. In other words, adaptively adjusting the number of bits stored in each cell may compensate for insufficient erase effect due to the cut-off voltage Vouter.

Although not shown, an erase operation of the sub-block SB0 may be performed similarly to that of the sub-block SB1. When the sub-block SB0 is erased, the cut-off voltage Vouter is be applied to the word line WL<3>, which is the only word line adjacent to an unselected sub-block (sub-block SB1), and the inner voltage Vinner is applied to the word lines WL<0> to WL<2>. When the sub-block SB0 is erased, unselected word lines WL<4> to WL<11> of the sub-blocks SB1 and SB2 are floated.

A bias condition of an erase operation performed on the sub-block SB2 is as follows. When the sub-block SB2 is erased, the cut-off voltage Vouter is applied to the word line WL<8>, which is the only word line adjacent to an unselected sub-block (sub-block SB1), and the inner voltage Vinner is applied to the word lines WL<9> to WL<11>. When the sub-block SB2 is erased, unselected word lines WL<0> to WL<7> of the sub-blocks SB1 and SB2 are floated.

The case in which the sub-blocks SB0, SB1 and SB2 are erased independently is described above. However, two or more sub-blocks can be erased simultaneously. For example, the two sub-blocks SB0 and SB1 may be erased at the same time. Alternatively, the two sub-blocks SB1 and SB2 or the two sub-blocks SB0 and SB2 may be erased at the same time. In each case, the cut-off voltage Vouter is applied to word line(s) of the selected sub-block(s) adjacent to an unselected sub-block. With the above-described bias condition, it is possible to effectively prevent interference with the unselected sub-blocks during a sub-block erase operation.

FIG. 5 is a diagram illustrating a bias method during a sub-block erase operation of a nonvolatile memory device, according to another embodiment of the inventive concept. Referring to FIG. 5, there is illustrated an erase bias condition corresponding to the case in which a memory block is divided into three sub-blocks. In the depicted embodiment, a cut-off voltage Vouter decreases by stages, to provide a bias for minimizing interference with unselected sub-blocks.

Each of cell strings constituting one memory block is divided into three sub-blocks SB0, SB1 and SB2. A bias condition of an erase operation will be described with reference to a cell string included in a memory block. It is assumed that one sub-block SB1 is erased and sub-blocks SB0 and SB2 are erase-inhibited.

An erase bias when the sub-block SB1 is erased is as follows. A bit line, a string selection line SSL1 and a ground selection line GSL are electrically floated. Also, word lines WL<0> to WL<k−1> and word line WL<2k> to WL<3k−1> corresponding to the unselected sub-blocks SB0 and SB2 are floated.

Word lines WL<k> to WL<2k−1> corresponding to the selected sub-block SB1 are provided with a bias according to an embodiment of the inventive concept. For example, a first cut-off voltage Vouter1 is applied to the word lines WL<k> and WL<2k−1> adjacent to the unselected sub-blocks SB 0 and SB2, and a second cut-off voltage Vouter2 is applied to word lines WL<k−1> and WL<2k−2> adjacent to the word lines WL<k> and WL<2k−1>, respectively. An inner voltage Vinner is applied to the remaining word lines, word lines WL<k+2> and WL<2k−3>. The inner voltage Vinner may be a ground voltage or 0V, for example. In an embodiment, the second cut-off voltage Vouter2 is lower than the first cut-off voltage Vouter1 and higher than the inner voltage Vinner.

Under the above-described bias condition, if an erase voltage Vers being a high voltage is applied to the substrate, memory cells in the sub-block SB1 are erased by F-N tunneling. Meanwhile, voltages of the floated word lines WL<0> to WL<k−1> and WL<2k> to WL<3k−1> are boosted up to a high voltage level by capacitive coupling. In this case, the voltage difference between the word lines WL<0> to WL<k−1> and WL<2k> to WL<3k−1> and a channel may be insufficient to generate F-N tunneling. Thus, the sub-blocks SB0 and SB2 are erase-inhibited. It is possible to perform a selective erase operation on the sub-block SB1 by the above-described bias condition.

The sub-block SB1 may include memory cells insufficiently erased due to the first and second cut-off voltages Vouter1 and Vouter2. The probability that memory cells of the word lines WL<k> and WL<2k−1> supplied with the first cut-off voltage Vouter1 are insufficiently erased is higher than the probability that memory cells of the word lines WL<k−1> and WL<2k−2> supplied with the second cut-off voltage Vouter2 are insufficiently erased. After the erase operation, the insufficiently erased memory cells may be used as an m-bit multi-level cell (MLC) or a single-level cell (SLC). For example, memory cells of the word lines WL<k> and WL<2k−1> supplied with the first cut-off voltage Vouter1 may be used as SLCs, and memory cells of word lines WL<k−1> and WL<2k−2> supplied with the second cut-off voltage Vouter2 may be used as m-bit MLCs. The remaining memory cells may be used as an n-bit MLC (n m, n being an integer) in a normal state. Accordingly, the above-described bias condition may compensate for the lowering of data reliability due to insufficient erasing of memory cells adjacent to unselected sub-blocks.

An erase operation of the sub-block SB0 may be performed similarly to that of the sub-block SB1. When the sub-block SB0 is erased, the first cut-off voltage Vouter1 is applied to the word line WL<k-1>, the second cut-off voltage Vouter2 is applied to the word line WL<k-2>, and the inner voltage Vinner is applied to the word lines WL<0> to WL<k-3>. When the sub-block SB0 is erased, unselected word lines WL<k> to WL<3k-1> are floated.

A bias condition of an erase operation performed on the sub-block SB2 is as follows. When the sub-block SB2 is erased, the first cut-off voltage Vouter1 is applied to the word line WL<2k>, the second cut-off voltage Vouter2 is applied to the word line WL<2k+1>, and the inner voltage Vinner is applied to the word lines WL<2k+2> to WL<3k-1>. When the sub-block SB2 is erased, unselected word lines WL<0> to WL<2k-1> are floated.

The case in which the sub-blocks SB0, SB1 and SB2 are erased independently is described above. However, two or more sub-blocks can be erased simultaneously. For example, two sub-blocks SB0 and SB1 may be erased at the same time. Alternatively, two sub-blocks SB1 and SB2 or two sub-blocks SB0 and SB2 may be erased at the same time. In each case, the first cut-off voltage Vouter1 is applied to word line(s) adjacent to an unselected sub-block and the second cut-off voltage Vouter2 sequentially applied to next adjacent word line(s). With the above-described bias condition, it is possible to effectively prevent interference with the unselected sub-blocks during a sub-block erase operation.

Figure 6:
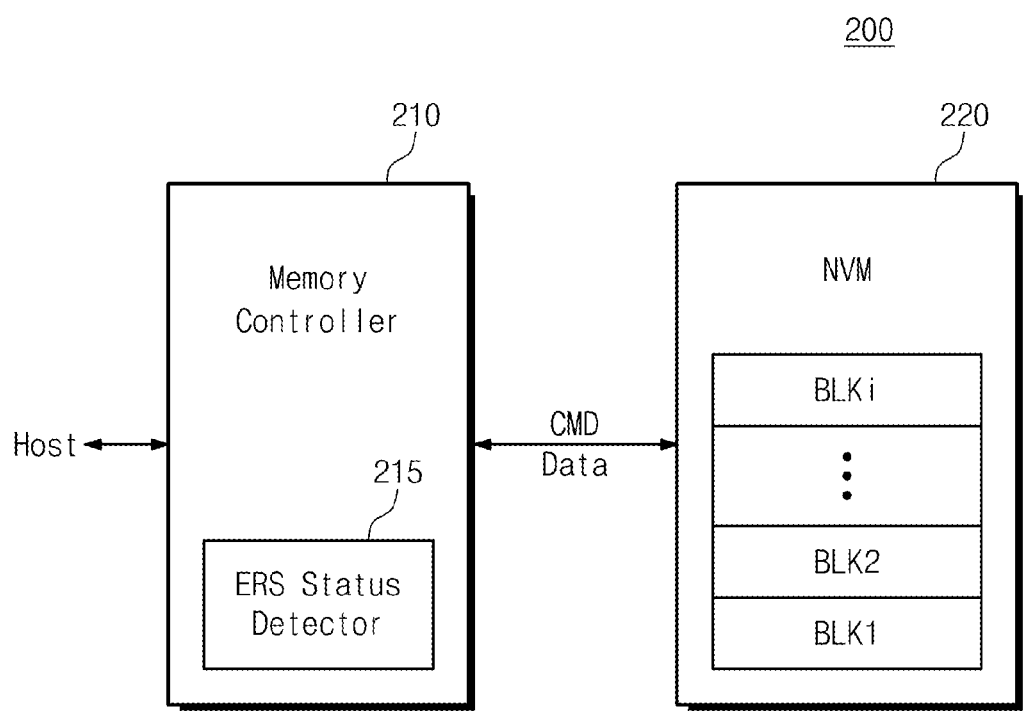
FIG. 6 is a block diagram illustrating a memory system, according to an embodiment of the inventive concept.

FIG. 6 is a block diagram illustrating, a memory system according to an embodiment of the inventive concept. Referring to FIG. 6, a memory system 200 includes a memory controller 210 and a nonvolatile memory device 220.

The memory controller 210 is configured to control the nonvolatile memory device 220, e.g., in response to requests of a host. The memory controller 210 is thus configured to interface with the host and the nonvolatile memory device 220. The memory controller 210 may control the nonvolatile memory device 220 in response to a write request of the host to write data therein. Likewise, the memory controller 210 may control a read operation of the nonvolatile memory device 220 in response to a read request from the host.

The memory controller 210 may include a flash translation layer (FTL). The FTL may be used to hide an erase operation of the nonvolatile memory device 220 between a file system of the host and the nonvolatile memory device 220. The FTL may compensate for drawbacks of the nonvolatile memory device 220, such as erase-before-write and mismatch between an erase unit and a write unit. During a write operation of the nonvolatile memory device 220, the FTL maps logical addresses generated by the file system to physical addresses of the nonvolatile memory device 220.

The memory controller 210 of the inventive concept controls the nonvolatile memory device 220 to perform erase operations by sub-block unit. After a sub-block erase operation, the memory controller 210 may check an erase status of an erased sub-block and/or a sub-block adjacent to the erased sub-block. For example, the memory controller 210 may sense memory cells of the erased sub-block to determine whether specific parameters exceed a reference value. The memory controller 210 may read data of sub-block(s) adjacent to the erased sub-block to detect erase-inhibition efficiency. This operation may be executed by an erase status detector 215 which is provided within the memory controller 210.

The erase status detector 215 may detect bit error rate (BER) based on data read from an erased sub-block. The erase status detector 215 may acquire and monitor wear-leveling information (e.g., erase count) on the erased sub-block. In addition, the erase status detector 215 may read data of the erased sub-block to monitor a variation in threshold voltages of selected memory cells and/or a variation in the bit error rate (BER). The erase status detector 215 also may read data of an unselected sub-block to detect a variation in a threshold voltage.

The memory controller 210 may perform various procedures for compensating for insufficient erasing of a selected sub-block based on erase status information detected by the erase status detector 215. For example, when an erase status of a selected sub-block does not reach a reference, the memory controller 210 may allocate a portion of memory cells of the erased sub-block to be used as m-bit MLCs or SLCs, which stores bits the number of which is less than that stored in a conventional n-bit MLC.

Alternatively, the memory controller 210 may adjust levels of cut-off voltages, such as cut-off voltages Vouter, Vouter1 and Vouter2, provided during a sub-block erase operation to be executed later, based on an erase status of the erased sub-block. In addition, the memory controller 210 may use a technique of adjusting levels of cut-off voltages Vouter, Vouter1, and Vouter2 and a technique of adjusting the number of bits stored in each cell in combination. This will be more fully described with reference to FIGS. 7 to 9, below.

Generally, a memory block is the maximum memory unit that may be erased at the same time. In a three-dimensional nonvolatile memory device, where word lines are stacked in a direction intersecting (e.g., perpendicular to) a substrate, a memory block may be defined as a group of cell strings sharing all stacked word lines. A sub-block corresponds to a sub-memory unit defined by dividing the memory block (or, physical block) by word line unit or selection line unit. For example, each sub-block may be formed of memory cells sharing a portion of the word lines of the memory block.

The nonvolatile memory device 220 may perform erase, read, and write operations under the control of the memory controller 210. The nonvolatile memory device 220 may include a plurality of memory blocks, each of which has a plurality of memory cells arranged in rows and columns. Each memory cell may store multi-level (or, multi-bit) data. The nonvolatile memory device 220 may be substantially the same as the nonvolatile memory device 100 of FIG. 1.

The nonvolatile memory device 220 includes a plurality of memory blocks BLK1 to BLKi, each of which is an erase unit. Each of the memory blocks BLK1 to BLKi includes a plurality of memory cells which are stacked in a direction intersecting a substrate to constitute a cell string. The capacity of one memory block generally increases significantly by forming the memory blocks BLK1 to BLKi to have the above-described three-dimensional structure.

As the capacity of a memory block increases, it is difficult to provide performance suitable for the increased capacity using a conventional control technique or algorithm. The memory system 200, according to an embodiment of the inventive concept, provides high performance with respect to the nonvolatile memory device 220 including mass memory blocks. The performance of the memory system 200 may be affected by the number of merge operations. However, with a block managing method according to an embodiment of the inventive concept, it is possible to reduce the number of merge operations appreciably with respect to mass blocks.

For example, waste of free blocks on input data may be minimized through log block allocation of a sub-block unit. With the block managing method according to an embodiment of the inventive concept, since an erase operation is performed by sub-block unit (as opposed to by memory block unit), the time required to perform the erase operation is reduced, thus improving performance. With the block managing method according to an embodiment of the inventive concept, the performance may be significantly improved by reducing the probability that a block erase operation and a page copy operation are generated during a merge operation.

As an example, a NAND flash memory will be described as a storage medium of the nonvolatile memory device 220. However, embodiments of the inventive concept are not limited thereto. For example, a PRAM, an MRAM, a ReRAM, a FRAM, or a NOR flash memory may be used as the storage medium. Also, embodiments may be applied to a memory system in which different types of memory devices are used together. For example, technical features may be applied to a storage device, such as a solid state drive (hereinafter, referred to as an SSD). In this case, the memory controller 110 may be configured to communicate with a host through one of various interface protocols, such as USB, MMC, PCI-E, SATA, PATA, IDE, E-IDE, SCSI, ESDI, and SAS.

Figure 7:
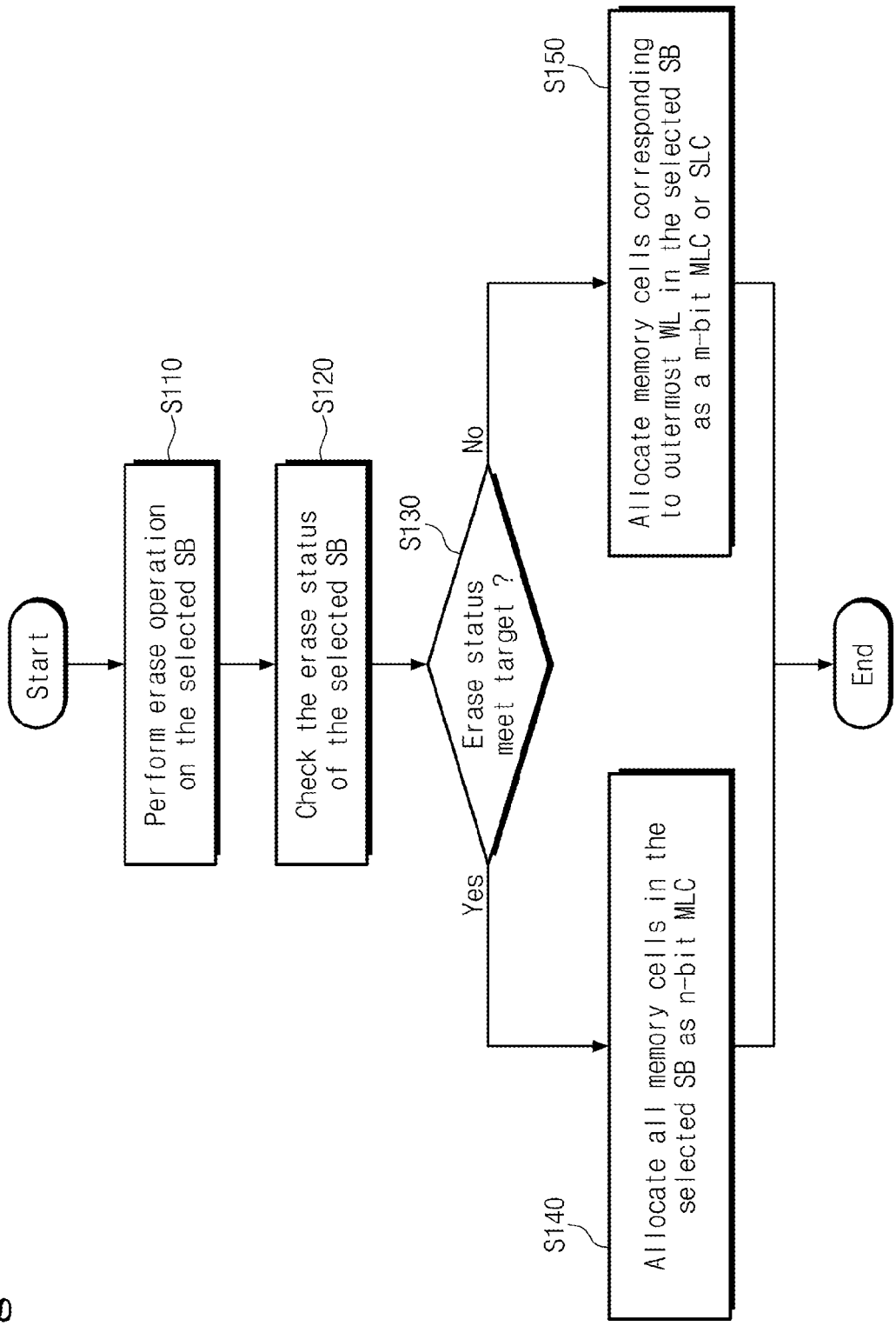
FIG. 7 is a flow chart illustrating a sub-block managing method, according to an embodiment of the inventive concept.

FIG. 7 is a flow chart illustrating a sub-block managing method, according to an embodiment of the inventive concept. Referring to FIG. 7, the sub-block managing method compensates for insufficient erasing during a sub-block erase operation.

In operation S110, an erase operation is performed on a selected sub-block. For example, the memory controller 210 (refer to FIG. 6) may control the nonvolatile memory device 220 to erase a selected sub-block. That is, the memory controller 210 may provide an erase command for a sub-block erase operation. The nonvolatile memory device 220 may respond to the erase command by erasing the selected sub-block according to an erase bias, described for example with reference to FIG. 4 or 5.

In operation S120, the erase status of the selected sub-block is checked (e.g., estimated). For example, the memory controller 210 may read data from the erased sub-block to detect an erase status. For example, the memory controller 210 may sense memory cells of the erased sub-block supplied with at least one of cut-off voltages Vouter, Vouter1, and Vouter2. The erase status detector 215 determines the erase status of the erased sub-block based on the read data of the erased sub-block. For example, the erase status detector 215 may detect whether the sub-block erase operation is performed insufficiently by detecting parameters such as a bit error rate (BER), wear-leveling information, or a variation in a distribution of erase threshold voltages based on the read data.

In operation S130, it is determined whether the detected erase status meets a target condition (or, a reference). When the detected erase status meets the target condition, the method proceeds to operation S140. When the detected erase status does not meet the target condition, the method proceeds to operation S150.

In operation S140, all memory cells in the selected sub-block are allocated as n-bit MLCs. For example, the memory controller 210 may allocate memory cells supplied with one of the cut-off voltages Vouter, Vouter1, and Vouter2 during a sub-block erase operation as n-bit multi-level cells like unselected memory cells.

In operation S150, memory cells corresponding to the outermost word line in the selected sub-block are allocated as an m-bit MLC or an SLC. For example, unlike unselected memory cells, the memory controller 210 may allocate memory cells supplied with one of the cut-off voltages Vouter, Vouter1, and Vouter2 during the sub-block erase operation as an m-bit MLC or SLC. The memory controller 210 may further comprise a storage means, such as a register, to adjust the number (m) of bits stored in each memory cell.

As described above, an erase status of memory cells supplied with a cut-off voltage during a sub-block erase operation may be detected. The number of bits stored in memory cells not meeting predetermined target condition (or, a reference) may be adjusted. Since the number of bits stored in memory cells not meeting the reference is less than the number of bits stored in normal memory cells, the data reliability of the program operation is secured.

Figure 8:
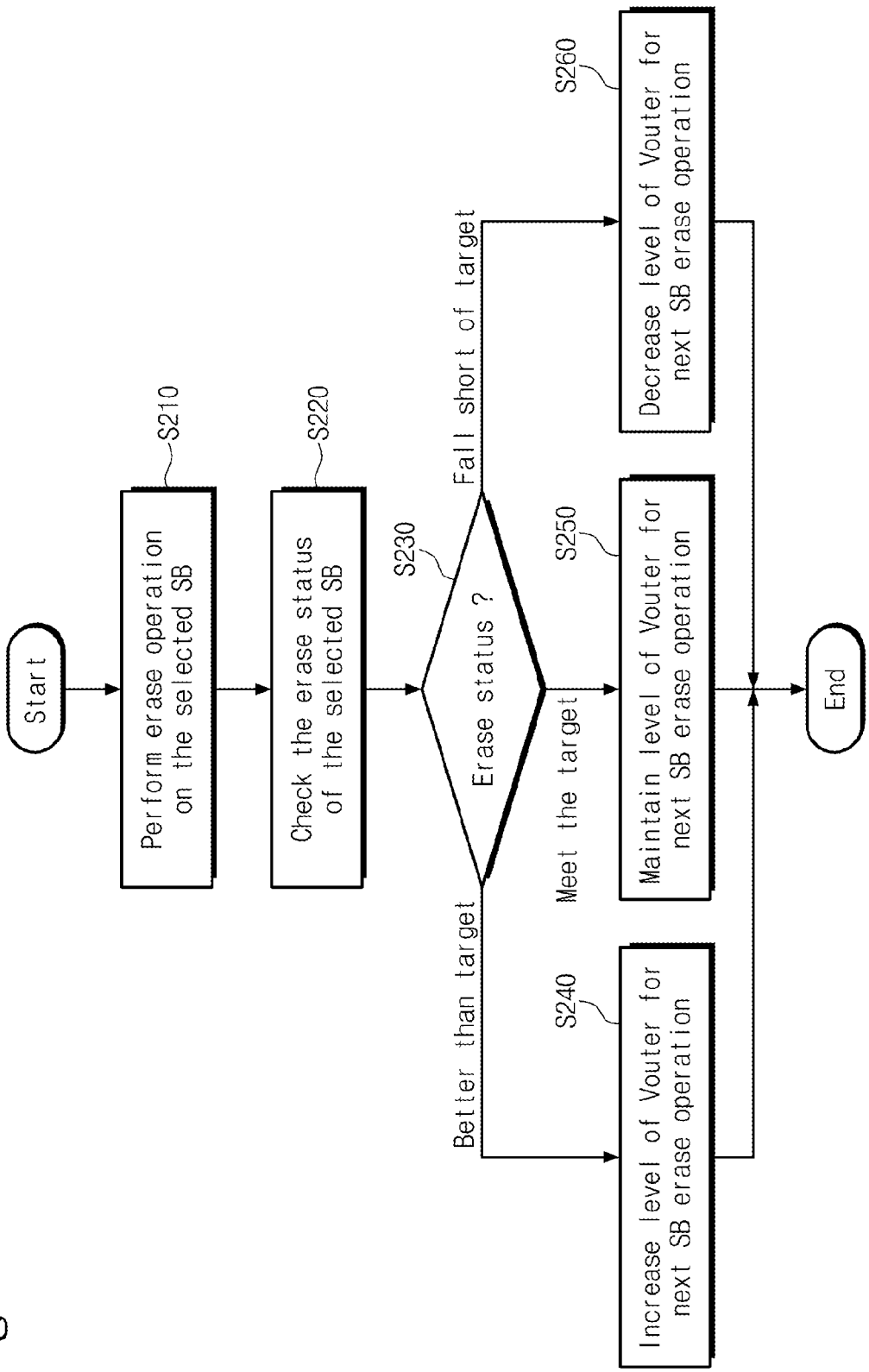
FIG. 8 is a flow chart illustrating a sub-block managing method, according to another embodiment of the inventive concept.

FIG. 8 is a flow chart illustrating a sub-block managing method, according to another embodiment of the inventive concept. Referring to FIG. 8, a memory controller 210 (refer to FIG. 6) adaptively adjusts a level of a cut-off voltage Vouter to be provided during a sub-block erase operation based on an erase status.

In operation S210, an erase operation is performed on a selected sub-block. For example, the memory controller 210 may control the nonvolatile memory device 220 (refer to FIG. 6) to erase the selected sub-block. The memory controller 210 may provide an erase command for a sub-block erase operation. The nonvolatile memory device 220 may respond to the erase command to erase the selected sub-block according to an erase bias, described for example with reference to FIG. 4 or 5.

In operation S220, the erase status of the selected sub-block is checked (e.g., estimated). For example, the memory controller 210 may read data from the erased sub-block to detect the erase status. For example, the memory controller 210 may sense memory cells of the erased sub-block supplied with at least one of cut-off voltages Vouter, Vouter1, and Vouter2. An erase status detector 215 decides the erase status of the erased sub-block based on read data of the erased sub-block. For example, the erase status detector 215 may detect whether the sub-block erase operation is performed insufficiently by detecting parameters such as BER, wear-leveling information, or a variation in a distribution of erase threshold voltages based on the read data.

In operation S230, the erase status is determined. For example, the erase status detector 215 may compare the detected erase status with a target (or, a reference). When the erase status of memory cells supplied with the cut-off voltage Vouter is better than the target, the method proceeds to operation S240. When the erase status of memory cells supplied with the cut-off voltage Vouter meets the target, the method proceeds to operation S250. When the erase status of memory cells supplied with the cut-off voltage Vouter falls short of the target, the method proceeds to operation S260.

In operation S240, the level of the cut-off voltage Vouter is increased for the next sub-block erase operation. For example, the memory controller 210 may increase the level of the cut-off voltage Vouter to be provided during the next sub-block erase operation. In consideration of the current erase status, since the memory cells supplied with the cut-off voltage Vouter are sufficiently erased, they may be determined to be erased over the target even though the cut-off voltage Vouter increases.

In operation S250, the level of the cut-off voltage Vouter is maintained for the next sub-block erase operation. For example, under the control of the memory controller 210, the same level of the cut-off voltage Vouter provided during the current sub-block erase operation may be applied to the next sub-block erase operation. This means that an optimum level of the cut-off voltage Vouter has been supplied to the sub-block from which the erase status is detected.

In operation S260, the level of the cut-off voltage Vouter is decreased for the next sub-block erase operation. For example, memory cells supplied with the cut-off voltage Vouter may be determined to be insufficiently erased. Thus, since outermost memory cells supplied with the cut-off voltage Vouter are insufficiently erased, the memory controller 210 may decrease the level of the cut-off voltage Vouter during the next sub-block erase operation.

Accordingly, the probability of insufficiently erasing each sub-block is reduced by adaptively adjusting the level of the cut-off voltage Vouter after the sub-block erase operation.

Figure 9:
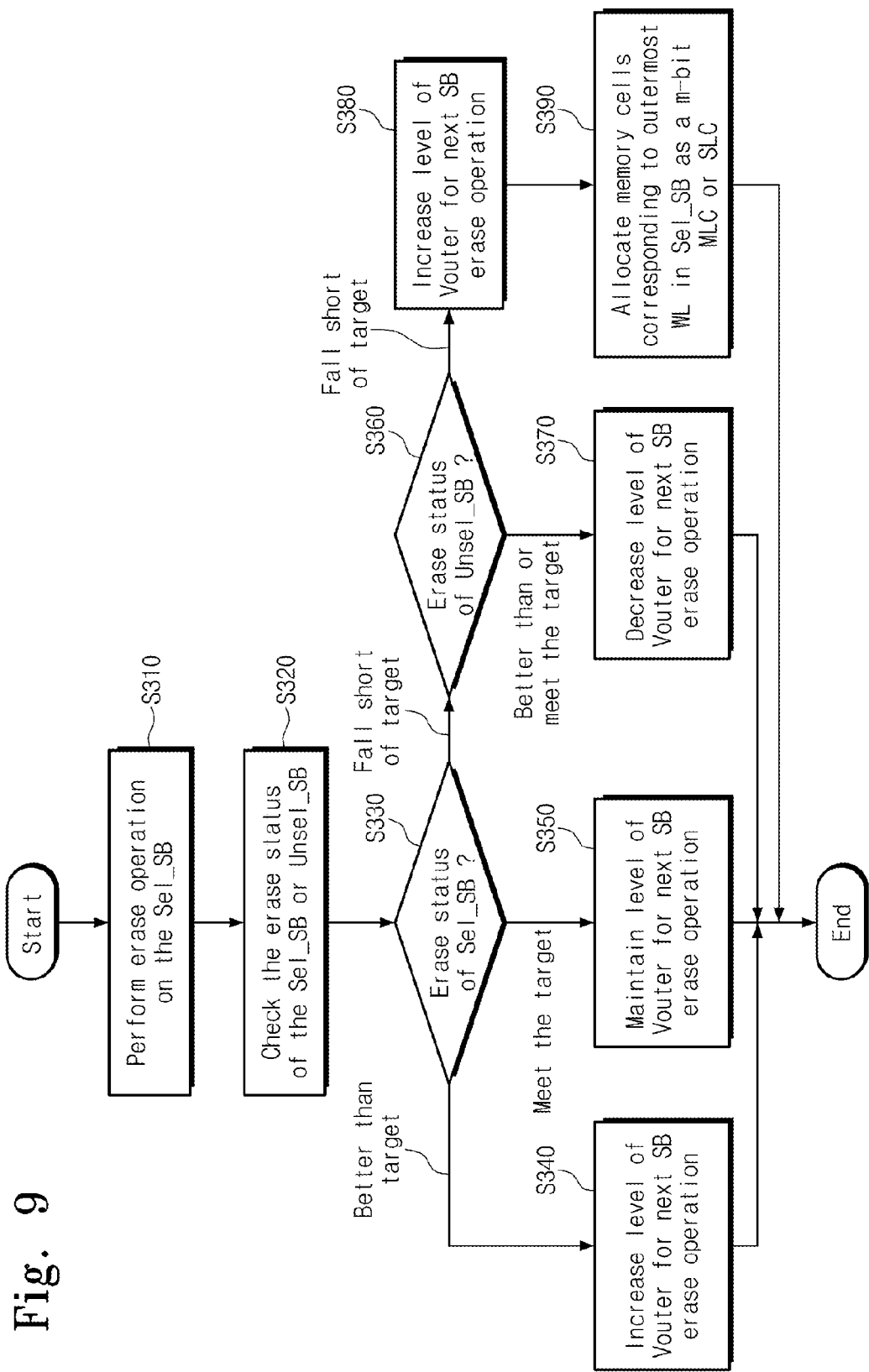
FIG. 9 is a flow chart illustrating a sub-block managing method, according to still another embodiment of the inventive concept.

FIG. 9 is a flow chart illustrating a sub-block managing method, according to still another embodiment of the inventive concept. Referring to FIG. 9, a memory controller 210 (refer to FIG. 6) may adaptively adjust the level of the cut-off voltage Vouter to be provided during the sub-block erase operation based on an erase status. In addition, data reliability on insufficiently erased memory cells may be provided through adjustment of the number of bits to be stored in insufficiently erased memory cells.

In operation S310, an erase operation is performed on a selected sub-block. For example, the memory controller 210 may control the nonvolatile memory device 220 (refer to FIG. 6) to erase a selected sub-block. The memory controller 210 may provide an erase command for the sub-block erase operation. The nonvolatile memory device 220 may respond to the erase command to erase a selected sub-block according to an erase bias described with reference to FIG. 4 or 5.

In operation S320, the erase status of the selected sub-block or an unselected sub-block is checked (e.g., estimated). For example, the memory controller 210 may read data from the erased sub-block or unselected sub-block to detect an erase status. For example, the memory controller 210 may sense memory cells of the erased sub-block supplied with at least one of cut-off voltages Vouter, Vouter1, and Vouter2. Alternatively, the memory controller 210 may read memory cells of a word line, adjacent to the selected sub-block, from among word lines of an unselected sub-block. The erase status detector 215 may decide an erase status of a sub-block based on the data read from one of the selected and/or unselected sub-blocks. For example, the erase status detector 215 may detect whether the sub-block erase operation is performed insufficiently by detecting parameters such as BER, wear-leveling information, or a variation in distribution of erase threshold voltages based on the read data. Also, the erase status detector 215 may estimate a level of interference with the unselected sub-block by the cut-off voltage Vouter.

In operation S330, the erase status of the selected sub-block is determined. For example, the erase status detector 215 may detect an erase status of the selected sub-block by comparing the detected erase status with a target (or, a reference). When the erase status of memory cells supplied with the cut-off voltage is better than the target, the method proceeds to operation S340. When the erase status of memory cells supplied with the cut-off voltage meets the target, the method proceeds to operation S350. When the erase status of memory cells supplied with the cut-off voltage falls short of the target, the method proceeds to operation S360.

In operation S340, the level of the cut-off voltage Vouter is increased for the next sub-block erase operation. For example, the memory controller 210 may increase the level of the cut-off voltage Vouter to be provided for the next sub-block erase operation. In consideration of the current erase status, since the memory cells supplied with the cut-off voltage Vouter are sufficiently erased, they may be determined to be erased over the target although the cut-off voltage Vouter increases.

In operation S350, the level of the cut-off voltage Vouter is maintained for the next sub-block erase operation. For example, under the control of the memory controller 210, the level of the cut-off voltage Vouter provided during the current sub-block erase operation may be applied to the next sub-block erase operation. This means that an optimum level of the cut-off voltage Vouter has been supplied to the sub-block from which the erase status is detected.

In operation S360, the erase status of an unselected sub-block is determined. For example, the erase status detector 215 may detect an erase-inhibition status based on read data provided from the unselected sub-block. For example, the erase status detector 215 may detect erase-inhibition efficiency based on data of memory cells, adjacent to the word line supplied with the cut-off voltage Vouter, from among memory cells of the unselected sub-block. The erase status detector 215 may detect a variation in a threshold voltage based on the read data or a variation in BER. When the erase-inhibition status of the unselected sub-block is over (better than) or meets a target (or, a reference), the method proceeds to operation S370. When the erase-inhibition status of the unselected sub-block does not reach the target, the method proceeds to operation S380.

In operation S370, the level of the cut-off voltage Vouter is decreased for the next sub-block erase operation. For example, the memory controller 210 may decrease the level of the cut-off voltage Vouter during the next sub-block erase operation.

In operation S380, the level of the cut-off voltage Vouter is increased for the next sub-block erase operation. For example, the memory controller 210 may increase the level of the cut-off voltage Vouter to be provided during the next sub-block erase operation. The cut-off voltage Vouter may by increased to improve the erase-inhibition efficiency on the unselected sub-block adjacent to the selected sub-block. An increase in the cut-off voltage Vouter may make it possible to reduce interference with the unselected sub-block during the sub-block erase operation.

In operation S390, memory cells corresponding to the outermost word line in the selected sub-block are allocated as an m-bit MLC or an SLC. For example, unlike unselected memory cells, the memory controller 210 may allocate memory cells of the selected sub-block supplied with the cut-off voltage Vouter as an m-bit MLC or SLC. Adjusting the number of bits to be stored in each memory cell may compensate for the lower of data reliability of the selected sub-block.

As described above, a sub-block may be managed based on an erase status of a selected sub-block and an erase inhibition status of an unselected sub-block. In particular, it may be determined that the erase status and/or the erase inhibition status are bad. In this case, erase-inhibition efficiency may be improved by increasing a level of a cut-off voltage Vouter. As mentioned above, adjusting the number of bits to be stored in each cell may compensate for the lower data reliability of insufficiently erased memory cells.

Combinations of cell-per-bit number adjustment and cut-off voltage adjustment are not be limited to this disclosure, and may be changed variously without departing from the scope of the present teachings.

Figure 10:
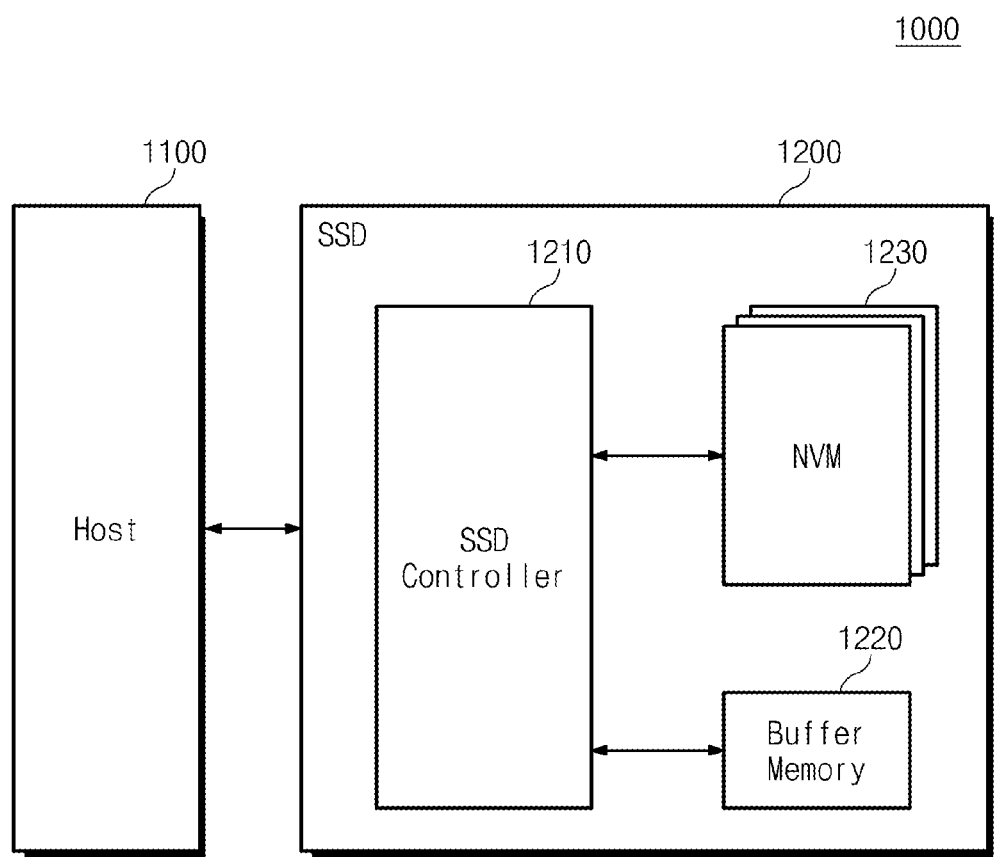
FIG. 10 is a block diagram illustrating a user device including a solid state drive, according to an embodiment of the inventive concept.

FIG. 10 is a block diagram illustrating a user device including a solid state drive, according to an embodiment of the inventive concept. Referring to FIG. 10, a user device 1000 includes a host 1100 and a solid state drive (SSD) 1200. The SSD 1200 includes an SSD controller 1210, a buffer memory 1220, and a nonvolatile memory device 1230.

The SSD controller 1210 provides physical interconnection between the host 1100 and the SSD 1200. The SSD controller 1210 also provides an interface with the SSD 1200 corresponding to a bus format of the host 1100. In particular, the SSD controller 1210 may decode commands provided from the host 1100 and accesses the nonvolatile memory device 1230 based on the decoding results. The bus format of the host 1100 may include, for example, USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 temporarily stores write data provided from the host 1100 or data read out from the nonvolatile memory device 1230. In the event that data existing in the nonvolatile memory device 1230 is cached, in response to a read request of the host 1100, the buffer memory 1220 may support a cache function to provide cached data directly to the host 1100. Typically, data transfer speed of a bus format (e.g., SATA or SAS) of the host 1100 is higher than that of a memory channel of the SSD 1200. In the event that the interface speed of the host 1100 is significantly faster, effects on performance due to the speed difference may be minimized by providing a large storage capacity for the buffer memory 1220.

The buffer memory 1220 may be formed of synchronous DRAM, for example, to provide sufficient buffering to the SSD 1200 used as an auxiliary mass storage device. However, the buffer memory 1220 is not limited to this disclosure, and may include other types of memory without departing from the scope of the present teachings.

The nonvolatile memory device 1230 is a storage medium of the SSD 1200. For example, the nonvolatile memory device 1230 may be formed of a vertical NAND flash memory device having a mass storage capacity. The nonvolatile memory device 1230 may be formed of a plurality of memory devices. In this case, the memory devices may be connected to the SSD controller 1210 by a channel unit, respectively. As a storage medium, the nonvolatile memory device 1230 may be formed of a NAND flash memory. However, the nonvolatile memory device 1230 is not limited to a NAND flash memory device, and may include other types of memory without departing from the scope of the present teachings. For example, a storage medium of the SSD 1200 may be formed of PRAM, MRAM, ReRAM, FRAM, NOR flash memory, and the like. Further, embodiments of the inventive concept may be applied to a memory system which uses different types of memory devices together. The nonvolatile memory device 1230 may be configured substantially the same as described with reference to FIG. 3, for example.

In the SSD 1200, the SSD controller 1210 may decide the size of data or log block adaptively according to the number of free blocks and a write pattern of input data. When the number of free blocks is less than a reference, the SSD controller 1210 may allocate a log block by sub-block unit regardless of the write pattern of the data. When the number of free blocks is less than the reference, the SSD controller 1210 may allocate a log block or data block by sub-block unit or physical block unit in view of the write pattern of the data. The SSD controller 1210 may adaptively adjust a cut-off voltage on insufficiently erased memory cells or a cell-per-bit number based on an erase status on a sub-block, as discussed above.

The nonvolatile memory device 1230 may operate the same as a nonvolatile memory device in FIG. 1, for example. That is, the nonvolatile memory device 1230 may include large-capacity memory blocks, each of which is selected and erased by sub-block unit. Interference with unselected sub-blocks may be blocked (or minimized) by providing a cut-off voltage Vouter to outermost word line(s) of a selected sub-block.

Figure 11:
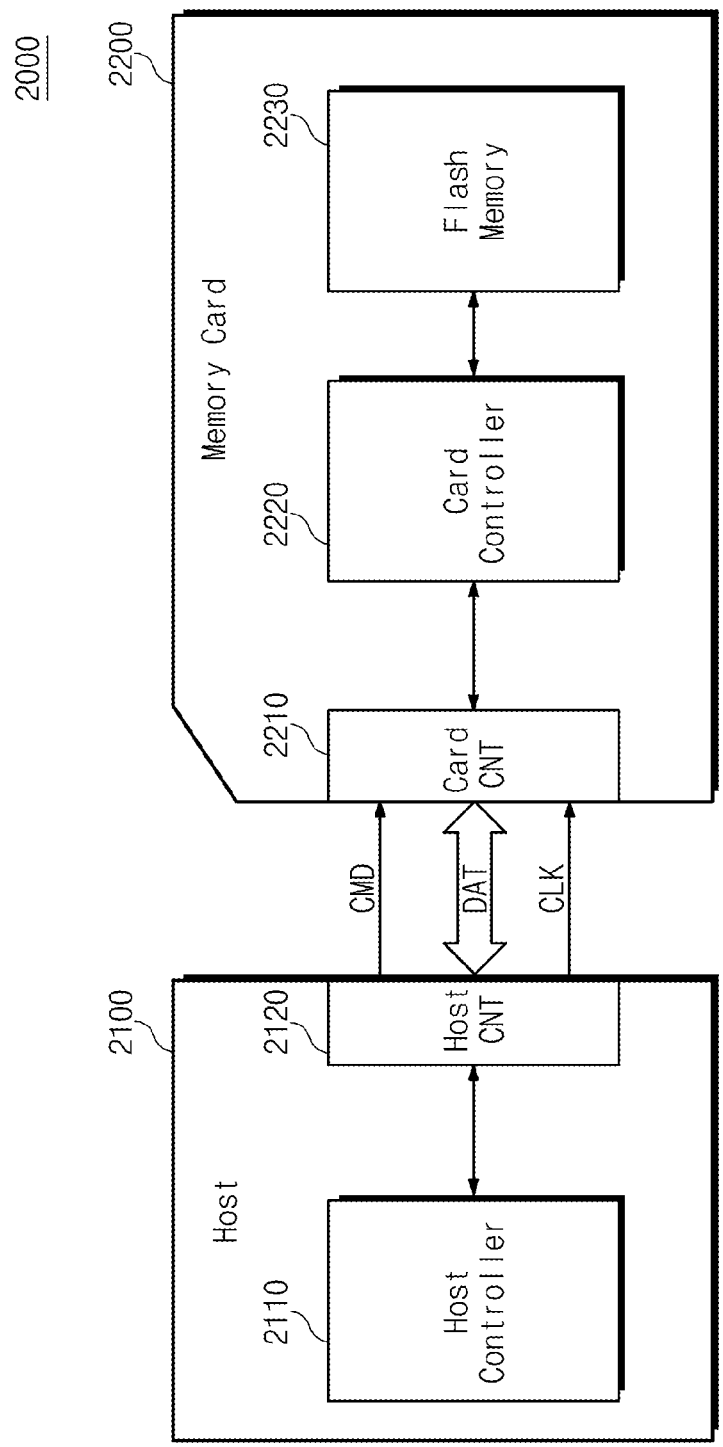
FIG. 11 is a block diagram illustrating a memory card, according to an embodiment of the inventive concept.

FIG. 11 is a block diagram illustrating a memory card, according to an embodiment of the inventive concept. Referring to FIG. 11, a memory card system 2000 includes a host 2100 and a memory card 2200. The host 2100 includes a host controller 2110 and a host connection unit 2120. The memory card 2200 includes a card connection unit 2210, a card controller 2220, and a flash memory 2230.

Each of the host connection unit 2120 and the card connection unit 2210 may be formed of a plurality of pins. Such pins may include a command pin, a data pin, a clock pin, a power pin, etc. The number of pins may vary according to the type of the memory card 2200. In various embodiments, an SD card may include nine pins.

The host 2100 may be configured to write data in the memory card 2200 or to read data stored in the memory card 2200. The host controller 2110 may send a command (e.g., a write command), a clock signal CLK generated by a clock generator (not shown) of the host 2100, and data to the memory card 2200 via the host connection unit 2120.

The card controller 2220 may operate in response to the write command received via the card connection unit 2210, and store data in the memory 2230 in synchronization with a clock signal generated by a clock generator (not shown) of the card controller 2220. The memory 2230 may store data transferred from the host 2100. For example, if the host 2100 is a digital camera, the memory 2230 may store image data.

The flash memory 2230 may include memory cells stacked in a direction perpendicular to a substrate, in accordance with embodiments of the inventive concept. The flash memory 2230 may erase memory cells by sub-block unit, and may provide a cut-off voltage Vouter to outermost word line(s) of a selected sub-block, as described above. The flash memory 2230 may be configured substantially the same as a nonvolatile memory device 100 of FIG. 1, for example.

The card controller 2220 may detect an erase status or an erase inhibition status by sub-block unit of the flash memory 2230. The card controller 2220 may adaptively adjust a level of the cut-off voltage Vouter supplied to a selected sub-block based on the detected erase status or erase inhibition status. Also, the card controller 2220 may adaptively adjust the number of bits to be stored in each of memory cells supplied with the cut-off voltage Vouter based on the detected erase status or erase inhibition status.

The card connection unit 2210 may be configured to communicate with an external device (e.g., the host 2100) using one of various interface protocols such as USB, MMC, PCI-E, SAS, SATA, PATA, SCSI, ESDI, IDE, and the like.

Figure 12:
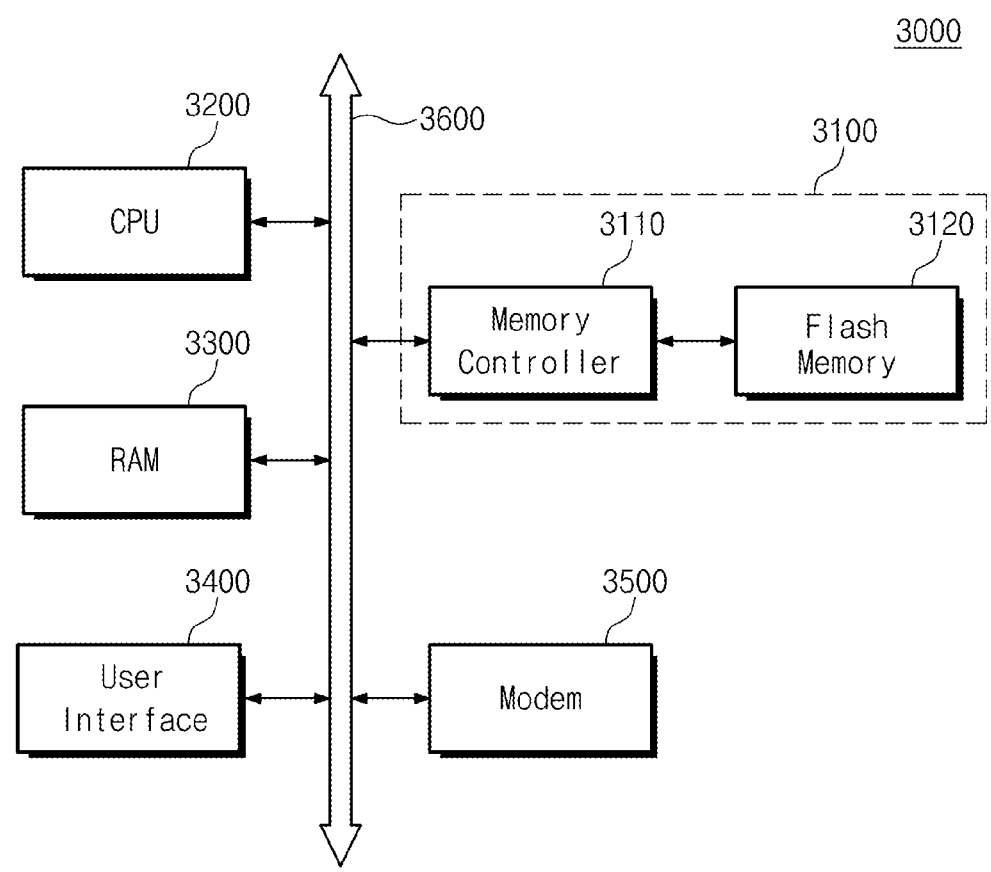
FIG. 12 is a block diagram illustrating a computing system including a flash memory device, according to an embodiment of the inventive concept.

FIG. 12 is a block diagram illustrating a computing system including a flash memory device, according to an embodiment of the inventive concept. A computing system 3000 include a central processing unit (CPU) 3200, RAM 3300, a user interface 3400, a modem 3500 such as a baseband chipset, and a memory system 3100, which are electrically connected with a system bus 3600. The memory system 3100 includes a memory controller 3110 and a flash memory 3120, and may be configured substantially the same as an SSD in FIG. 10 or a memory card in FIG. 11.

If the computing system 3000 is a mobile device, it may further include a battery (not shown) which powers the computing system 3000. Although not shown in FIG. 12, the computing system 3000 may further include an application chipset, a camera image processor (CIS), a mobile DRAM, and the like. The memory system 3100 may be a solid state drive/disk (SSD) which uses a nonvolatile memory to store data. Alternatively, the memory system 3100 may be formed of a fusion flash memory (e.g., a One-NAND flash memory).

A memory controller 3110 may detect an erase status or an erase inhibition status by sub-block unit of the flash memory 3120. The memory controller 3110 may adaptively adjust a level of a cut-off voltage Vouter supplied to a selected sub-block based on the detected erase status or erase inhibition status. Also, the memory controller 3110 may adaptively adjust the number of bits to be stored in each of memory cells supplied with the cut-off voltage Vouter based on the detected erase status or erase inhibition status.

The nonvolatile memory device and/or the memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A nonvolatile memory device comprising:
a memory block including memory cells stacked in a direction intersecting a substrate, the memory block being divided into a plurality of sub-blocks configured to be erased independently;
a row decoder configured to select the memory block by a sub-block unit;
a voltage generator configured to generate an erase word line voltage to be provided to a first word line of a selected sub-block of the plurality of sub-blocks and a first cut-off voltage, higher than the erase word line voltage, to be provided to a second word line of the selected sub-block during an erase operation; and
control logic configured to control the row decoder and the voltage generator to perform an erase operation on the selected sub-block.

2. The nonvolatile memory device of claim 1, wherein the second word line is adjacent to an unselected sub-block of the plurality of sub-blocks.

3. The nonvolatile memory device of claim 2, wherein the first cut-off voltage is lower than voltages of word lines of the unselected sub-blocks floated during the erase operation.

4. The nonvolatile memory device of claim 1, wherein the voltage generator is further configured to generate an erase voltage to be applied to a bulk of the memory block during the erase operation.

5. The nonvolatile memory device of claim 2, wherein the voltage generator is further configured to generate a second cut-off voltage to be applied a third word line of the selected sub-block during the erase operation, the third word line being adjacent to the second word line.

6. The nonvolatile memory device of claim 5, wherein the second cut-off voltage applied to the third word line is lower than the first cut-off voltage applied to the second word line.

7. The nonvolatile memory device of claim 1, wherein the number of bits stored in each memory cell connected to the second word line is less than the number of bits stored in each memory cell connected to the first word line.

8. The nonvolatile memory device of claim 1, wherein a level of the first cut-off voltage is adjusted according to an erase status of memory cells connected to the second word line.

9. A sub-block managing method of a memory system comprising a nonvolatile memory device to erase memory cells by sub-block unit, a sub-block being smaller than a physical block of the nonvolatile memory device, the method comprising:
performing an erase operation on a selected sub-block by providing at least one word line of the selected sub-block with a cut-off voltage for blocking interference with an unselected sub-block;
checking an erase status of the selected sub-block; and
adaptively compensating for data reliability of memory cells connected to the at least one word line provided with the cut-off voltage based on the checked erase status.

10. The sub-block managing method of claim 9, wherein the at least one word line supplied with the cut-off voltage is adjacent to the unselected sub-block, the cut-off voltage being higher than an erase word line voltage provided to remaining word lines of the selected sub-block.

11. The sub-block managing method of claim 9, wherein adaptively compensating for the data reliability comprises adjusting and allocating the number of bits stored in each of the memory cells connected to the at least one word line provided with the cut-off voltage.

12. The sub-block managing method of claim 11, wherein the number of bits stored in each of the memory cells decreases when the erase status of the selected sub-block does not reach a reference.

13. The sub-block managing method of claim 9, wherein adaptively compensating for the data reliability comprises adjusting a level of the cut-off voltage.

14. The sub-block managing method of claim 9, further comprising:
checking an erase inhibition status of the unselected sub-block.

15. The sub-block managing method of claim 14, wherein when the erase status and the erase inhibition status do not reach a reference, respectively, adaptively compensating for the data reliability comprises:
increasing a level of the cut-off voltage; and
decreasing the number of bits stored in each of memory cells connected to the at least one word line provided with the cut-off voltage.

16. A memory system, comprising:
nonvolatile memory device, comprising:
a memory cell array comprising at least one memory block divided into a plurality of sub-blocks, each sub-block comprising a plurality of word lines; and
a voltage generator configured to provide a first cut-off voltage and an inner voltage to a sub-block selected from among the plurality of sub-blocks for an erase operation under control of control logic, the first cut-off voltage being higher than the inner voltage; and
a memory controller configured to control the nonvolatile memory device to perform the erase operation of the selected sub-block in response to a request from a host, wherein the voltage generator is configured to provide the first cut-off voltage to a first word line of the plurality of word lines in the selected sub-block adjacent to an unselected sub-block, and to provide the inner voltage to word lines in the selected sub-block that are not adjacent to the unselected sub-block during the erase operation.

17. The memory system of claim 16, wherein the voltage generator is further configured to provide a second cut-off voltage, less than the first cut-off voltage and greater than the inner voltage, to a second word line of the plurality of word lines in the selected sub-block adjacent to the first word line during the erase operation.

18. The memory system of claim 16, wherein the memory controller comprises an erase status detector configured to check an erase status of the selected sub-block after the erase operation.

19. The memory system of claim 18, wherein when the erase status of the selected sub-block does not reach a reference, the memory controller allocates a portion of memory cells of the selected sub-block that are insufficiently erased to store an adjusted number of bits.

20. The memory system of claim 18, wherein when the erase status of the selected sub-block does not reach a reference, the memory controller adjusts a level of the first cut-off voltage provided during a subsequent erase operation of the selected sub-block.

* * * * *